(12) United States Patent
Ha

(10) Patent No.: US 11,527,954 B2
(45) Date of Patent: Dec. 13, 2022

(54) REGULATOR CIRCUIT AND FRONT END MODULE INCLUDING THE SAME

(71) Applicant: Samsung Electro-Mechanics Co., Ltd, Suwon-si (KR)

(72) Inventor: Sanghoon Ha, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 50 days.

(21) Appl. No.: 17/210,573

(22) Filed: Mar. 24, 2021

(65) Prior Publication Data

US 2022/0149726 A1 May 12, 2022

(30) Foreign Application Priority Data

Nov. 12, 2020 (KR) .................. 10-2020-0150750

(51) Int. Cl.
*H02M 3/155* (2006.01)
*H03K 19/20* (2006.01)

(52) U.S. Cl.
CPC .......... *H02M 3/155* (2013.01); *H03K 19/20* (2013.01)

(58) Field of Classification Search
None
See application file for complete search history.

(56) References Cited

U.S. PATENT DOCUMENTS

| 7,808,308 | B2* | 10/2010 | Lai | ........................ G05F 3/24 |
| | | | | 327/541 |
| 9,225,237 | B2* | 12/2015 | Ferrant | ................ H02M 3/07 |
| 11,190,189 | B1* | 11/2021 | Huss | ................ H03K 5/1565 |
| 2007/0272988 | A1 | 11/2007 | Kwon et al. | |

FOREIGN PATENT DOCUMENTS

| KR | 10-0154822 B1 | 12/1998 |
| KR | 10-0671591 B1 | 1/2007 |
| KR | 10-0780209 B1 | 11/2007 |

* cited by examiner

*Primary Examiner* — Jeffery S Zweizig
(74) *Attorney, Agent, or Firm* — NSIP Law

(57) ABSTRACT

A regulator circuit and a front-end module including the same may be disclosed. The regulator circuit may include a first output voltage generator and a second output voltage generator. The first output voltage generator may include a first resistor having a first end connected to power supplied from an outside, a first transistor connected between a second end of the first resistor and a ground terminal to supply a first voltage, and a second transistor receiving the first voltage through a control terminal and outputting a first output voltage through a first terminal. The second output voltage generator may be connected between the power and the first output voltage generator to output a second output voltage obtained by adding a predetermined voltage into the first output voltage.

20 Claims, 10 Drawing Sheets

REGULATOR CIRCUIT AND FRONT END MODULE INCLUDING THE SAME

CROSS-REFERENCE TO RELATED APPLICATION

This application claims the benefit under 35 USC 119(a) of Korean Patent Application No. 10-2020-0150750, filed in the Korean Intellectual Property Office on Nov. 12, 2020, the entire disclosure of which is incorporated herein by reference for all purposes.

BACKGROUND

1. Field

The following description relates to a regulator circuit and a front end module including the same.

2. Description of Related Art

A front-end module integrated circuit (IC) (e.g., a WiFi front-end module IC) has been developing at a rapid pace every year with the trend of miniaturization and low power consumption.

Previously, a power management IC (PMIC) was used as a power source for the front-end module IC. The PMIC serves to supply a constant voltage and current. On the other hand, in recent years, a method of directly using a battery of a communication device is changing without using a PMIC depending on a trend of miniaturization and low power consumption.

A battery of the communication device may have a voltage change of, e.g., a voltage change of about 3.0 V to 4.6 V. Such a voltage change may have a significant impact on the performance of a front-end module, and may cause damage to circuits and components inside the front-end module IC.

The above information disclosed in this Background section is only for enhancement of understanding of the background of the invention and, therefore, it may contain information that does not form the prior art and will be apparent after an understanding of the disclosure of this application.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a regulator circuit includes: a first output voltage generator configured to include a first resistor having a first end connected to a power terminal having externally supplied power, a first transistor connected between a second end of the first resistor and a ground terminal to supply a first voltage, and a second transistor receiving the first voltage through a control terminal of the second transistor and outputting a first output voltage through a first terminal of the second transistor; and a second output voltage generator connected between the power terminal and the first output voltage generator to output a second output voltage obtained by adding a predetermined voltage into the first output voltage.

The second output voltage generator may include: a second resistor connected between the power terminal and the first resistor; and a third transistor configured to receive a second voltage obtained by adding a voltage across the first resistor into the first voltage through a control terminal of the third transistor, and to output the second output voltage through a first terminal of the third transistor.

A second terminal of the third transistor may be connected to the power terminal, and a first terminal of the third transistor may be connected to a second terminal of the second transistor.

The first output voltage generator may further include a second resistor connected between the first terminal of the second transistor and the ground terminal.

The first output voltage generator may further include a third transistor configured to have a control terminal of the third transistor connected to the control terminal of the first transistor, a first terminal of the third transistor connected to the second resistor, and a second terminal of the third transistor connected to the first terminal of the second transistor.

A control terminal and a first terminal of the first transistor may be connected to each other, the first terminal of the first transistor may be connected to the second end of the first resistor, and a second terminal of the first transistor may be connected to the ground terminal.

The first transistor may include a plurality of transistors having a diode-connection structure, and the plurality of transistors may supply the first voltage to the control terminal of the second transistor.

The regulator circuit may include: a third output voltage generator configured to include a third resistor connected between the power and the second resistor; and a fourth transistor configured to receive a third voltage obtained by adding a voltage across the second resistor into the second voltage through a control terminal and to output a third output voltage through a first terminal.

The first transistor may include a plurality of transistors having a diode-connection structure, and the plurality of transistors may supply the first voltage to the control terminal of the second transistor.

The regulator circuit may further include a third output voltage generator configured to include a third resistor connected between the power terminal and the second resistor, and a fourth transistor configured to receive a third voltage obtained by adding a voltage across the second resistor into the second voltage through a control terminal of the fourth transistor, and output a third output voltage through a first terminal of the fourth transistor.

The third output voltage may be higher than the second output voltage.

The power of the power terminal may be supplied from a battery.

In another general aspect, a regulator circuit includes a first resistor, a second resistor, a first transistor, a second transistor, a third transistor, and a third resistor. The first resistor is configured to have a first end connected to a power terminal. The second resistor is configured to have a first end connected to a second end of the first resistor. The first transistor, connected between a second end of the second resistor and a ground terminal, is configured to supply a first voltage. The second transistor is configured to receive the first voltage through a control terminal, and output the first output voltage through a first terminal. The third transistor is configured to receive a second voltage obtained by adding a voltage across the second resistor into the first voltage through a control terminal of the third transistor, and output a second output voltage through a first terminal of the third transistor. The third resistor is connected between the first terminal of the second transistor and the ground terminal.

The control terminal and a first terminal of the first transistor may be connected to each other.

The second terminal of the third transistor may be connected to the power terminal, and the first terminal of the third transistor may be connected to a second terminal of the second transistor.

The regulator circuit may further include a fourth transistor configured to have a control terminal connected to the control terminal of the first transistor, a first terminal connected to the third resistor, and a second terminal connected to the first terminal of the second transistor.

The first transistor may have a diode-connection structure and may include a plurality of transistors stacked between the second end of the second resistor and the ground terminal. The plurality of transistors may supply the first voltage to a control terminal of the first transistor.

The regulator circuit may further include a fourth resistor connected between the power terminal and the first resistor, and a fourth transistor configured to receive a third voltage obtained by adding a voltage across the first resistor into the second voltage through a control terminal of the fourth transistor, and output a third output voltage through a first terminal of the fourth transistor.

The second output voltage may be higher than the first output voltage, and the third output voltage is higher than the second output voltage.

In another general aslect, a front-end module include a regulator and an inverter unit. The regulator is configured to include a first output voltage generator connected between a power terminal and a ground terminal to output a first output voltage, and a second output voltage generator connected between the power terminal and the first output voltage generator to output a second output voltage obtained by adding a predetermined voltage into the first output voltage. The inverter unit includes a first inverter configured to operate by receiving the first output voltage to output the first output voltage in response to an input signal, and a second inverter configured to operate by receiving the second output voltage to output the second output voltage in response to an output signal of the first inverter.

The regulator circuit may further include a third output voltage generator connected between the power terminal and the second output voltage generator to output a third output voltage obtained by adding a predetermined voltage into the second output voltage. The inverter unit may further include a third inverter configured to operate by receiving the third output voltage to output the third output voltage in response to an output signal of the second inverter.

The second output voltage may be equal to or higher than a voltage obtained by subtracting a threshold voltage of a transistor included in the third inverter from the third output voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
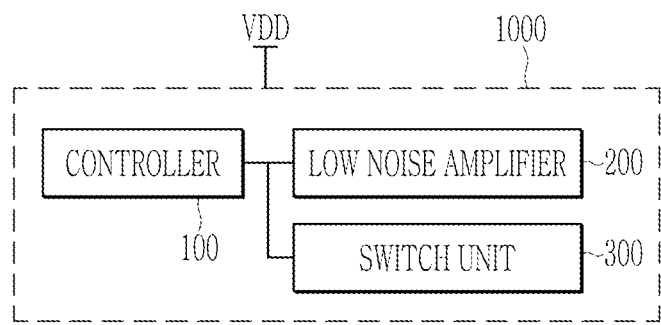
FIG. 1 illustrates an example of a front-end module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Throughout this specification and the claims that follow, RF signals may include Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but the present invention is limited thereto.

In addition, unless explicitly described to the contrary, the word "comprise" and variations such as "comprises" or "comprising" will be understood to imply the inclusion of stated elements but not the exclusion of any other elements.

FIG. 1 illustrates an example of a front-end module.

As illustrated in FIG. 1, the front end module 1000 may include a controller 100, a low noise amplifier 200, and a switch unit 300.

The front-end module 1000 may receive a power VDD from an external source and be operated by the received power VDD. Herein, the power VDD may be supplied from a battery of a communication device in which the front-end module 1000 is mounted. That is, the front-end module 1000 may operate by receiving power VDD directly from the battery. As an example, the power VDD supplied from the battery may have a voltage of 3.0 to 4.6 V. The front-end module 1000 may be implemented as one integrated circuit (IC).

The controller 100 serves to control the low noise amplifier 200 and the switch unit 300. The controller 100 may control operations of transistors included in the low noise amplifier 200. In addition, the controller 100 may control the operations of the transistors included in the switch unit 300. Further, the controller 100 may convert a voltage supplied from the power VDD into a regulating voltage to supply the regulating voltage to the low noise amplifier 200 and/or the switch unit 300.

The low noise amplifier 200 may amplify a received radio frequency RF under the control of the controller 100. In addition, the low noise amplifier 200 may receive a regulating voltage as a bias (operation) voltage from the controller 100.

The switch unit 300 may include a plurality of switches, and may selectively switch a transmission RF signal and a reception RF signal under the control of the controller 100. In addition, the switch unit 300 may receive a regulating voltage as a bias (operation) voltage from the controller 100.

Figure 2:
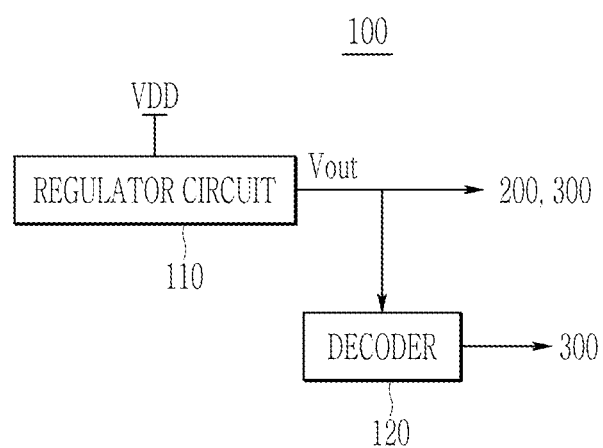
FIG. 2 illustrates an example of a controller.

FIG. 2 illustrates an example of a controller.

As illustrated in FIG. 2, the controller 100 may include a regulator circuit 110 and a decoder 120.

The regulator circuit 110 receives the power VDD externally supplied and converts the received power VDD into a predetermined regulating voltage Vout. The regulating voltage Vout may be supplied to the low noise amplifier 200 and/or the switch unit 300. In addition, the regulating voltage Vout may be supplied (input) to the decoder 120. Additionally, the regulator circuit 110 may generate and output a plurality of regulating voltages (e.g., Vout1 and Vout2) as the regulating voltage Vout. Hereinafter, since the regulating voltage Vout corresponds to an output voltage of the regulator circuit 110, the term "regulating voltage Vout" may be used interchangeably with the term "output voltage Vout."

Figure 9:
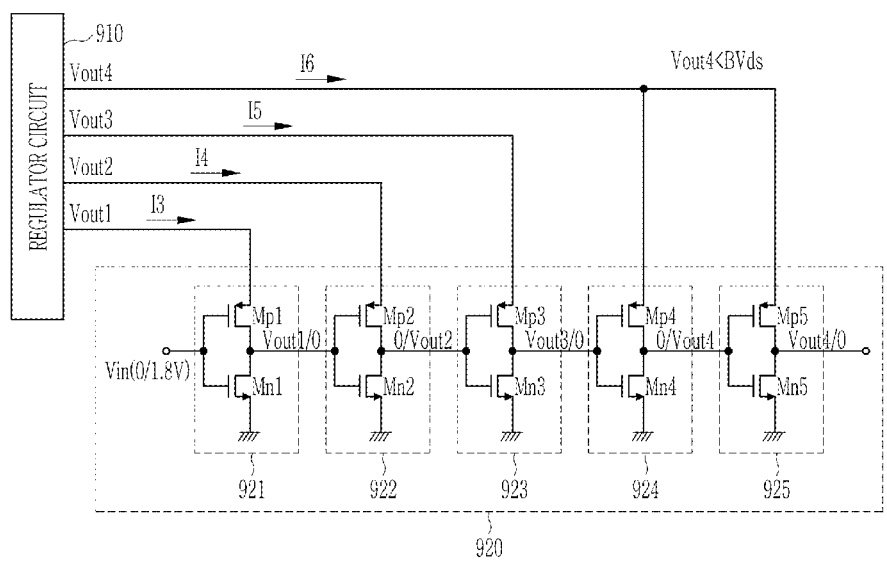
FIG. 9 illustrates an application example of a regulator circuit.

The decoder 120 receives an external control bit to generate a switching signal in response to the control bit. The decoder 120 may output the generated switching signal to the switch unit 300. The switch unit 300 may turn on or turn off a switch included therein in response to the switching signal that is inputted from the decoder 120. In addition, the decoder 120 may receive a regulating voltage Vout as operating power from the regulator circuit 110. The decoder 120 may include a logic circuit and an inverter, and the logic circuit and the inverter may be biased by the regulating voltage Vout. With reference to FIG. 9 below, an example in which the regulating voltage Vout is applied to an inverter chain will be described, but the regulating voltage Vout may be used as power that is supplied for other circuit elements.

Figure 3:
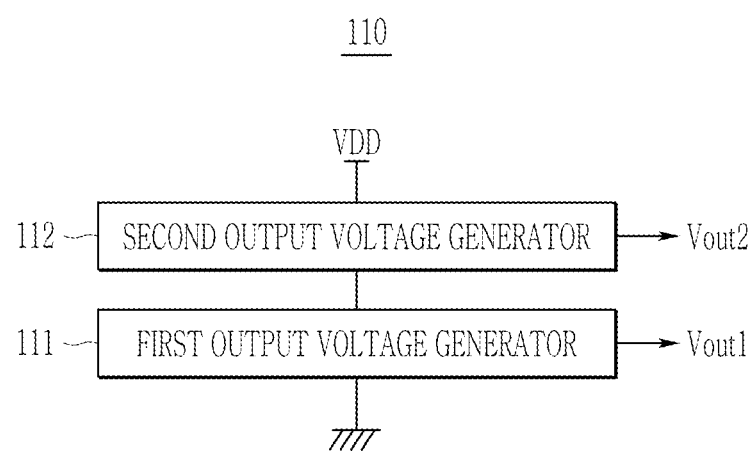
FIG. 3 illustrates an example of a regulator circuit.

FIG. 3 illustrates an example of a regulator circuit.

As illustrated in FIG. 3, the regulator circuit 110 may include a first output voltage generator 111 and a second output voltage generator 112.

The first output voltage generator 111 may be connected between the power VDD and ground to generate and output the first output voltage Vout1. Herein, the first output voltage Vout1 corresponds to a regulating voltage of the regulator circuit 110.

The second output voltage generator 112 may be connected between the power VDD and the first output voltage generator 111 to generate and output a second output voltage Vout2, a voltage obtained by adding a predetermined voltage to the first output voltage Vout. Herein, the second output voltage Vout2 also corresponds to the regulating voltage of the regulator circuit 110.

As described with reference to FIG. 3, the regulator circuit 110 may generate and output the first output voltage Vout1 and the second output voltage Vout2, a plurality of regulating voltages.

Figure 4:
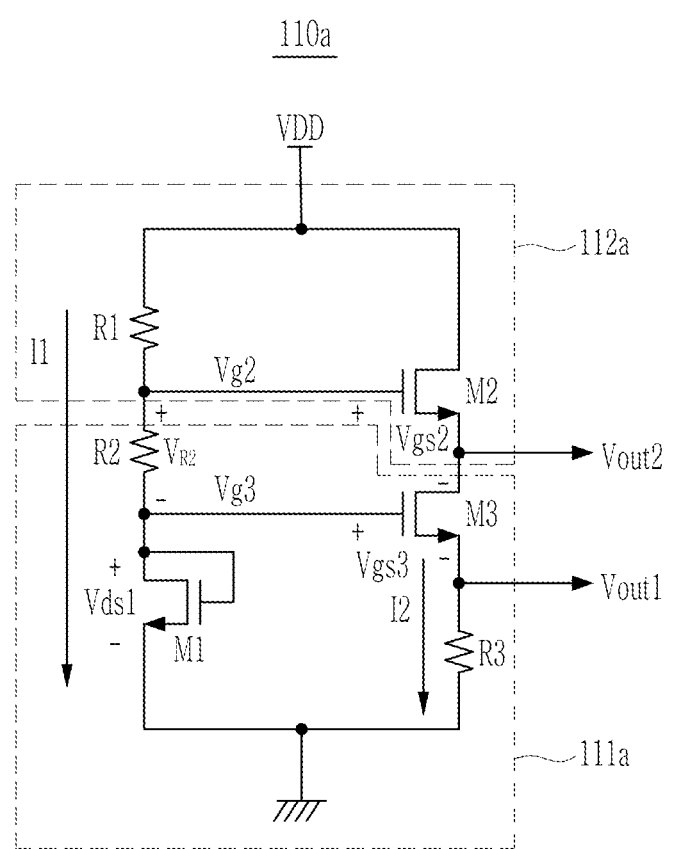
FIG. 4 illustrates an example of a circuit diagram showing a specific configuration of a regular circuit.

FIG. 4 illustrates an example of a circuit diagram showing a specific configuration of a regular circuit.

As illustrated in FIG. 4, the regulator circuit 110a may include a first output voltage generator 111a and a second output voltage generator 112a.

The first output voltage generator 111a may include a transistor M1, a transistor M3, a resistor R2, and a resistor R3. In addition, the second output voltage generator 112a may include a resistor R1 and a transistor M2.

A gate and a drain of the transistor M1 are connected to each other, and a source of the transistor M1 is connected to a ground. That is, the transistor M1 has a diode-connection structure. A gate of the transistor M3 is connected to the drain of the transistor M1, and a first end of the resistor R2 is connected to the drain of the transistor M1 and the gate of the transistor M3. The resistor R3 is connected between a source of the transistor M3 and the ground.

The resistor R1 is connected between the power VDD and a second end of the resistor R2. The gate of the transistor M2 is connected to a contact point between the resistor R1 and the resistor R2, and a drain of the transistor M2 is connected to the power VDD. In addition, a source of the transistor M2 is connected to the drain of the transistor M3.

The transistors M1, M2, and M3 may be a field effect transistor (FET), a metal oxide semiconductor field effect transistor (MOSFET), a bipolar junction transistor (BJT), or the like. Further, other transistors described below may also be a FET, a MOSFET, or a BJT.

In FIG. 4, a source voltage of the transistor M3 corresponds to the first output voltage Vout1, and a source voltage of the transistor M2 corresponds to the second output voltage Vout2. Further, in FIG. 4, a drain-source voltage of the transistor M1 is represented as Vds1, and a gate voltage of the transistor M3 is represented as Vg3. In addition, a gate-source voltage of the transistor M3 is represented as Vgs3, and a voltage across the resistor R2 is represented as VR2. A gate voltage of the transistor M2 is represented as Vg2, and a gate-source voltage of the transistor M2 is represented as Vgs2.

In FIG. 4, the drain-source voltage Vds1 of the transistor M1 corresponds to the gate voltage Vg3 of the transistor M3. Accordingly, the transistor M1 serves to supply the gate voltage of the transistor M3. That is, a relationship of Equation 1 below may be established.

$$Vg3 = Vds1 \qquad \text{Equation 1:}$$

Herein, the first output voltage Vout1 corresponds to a value obtained by subtracting the gate-source voltage Vgs3 of the transistor M3 from the gate voltage Vg3 of the transistor M3. That is, a relationship of Equation 2 below may be established for the first output voltage Vout1.

$$Vout1 = Vg3 - Vgs3 = Vds1 - Vgs3 \qquad \text{Equation 2:}$$

In Equations 1 and 2, Vds1 and Vgs3 are determined depending on the design process of the transistors M1 and M3.

Further, the resistor R1 and the resistor R2 serve to determine a magnitude of a current I1. Since the value of Vds1 is determined by the design process, the current I1 is determined by the resistors R1 and R2. The resistor R3 serves to determine a magnitude of a current I2. Assuming that a voltage across the resistor R2 is $V_{R2}$, the gate voltage Vg2 of the transistor M2 is shown in Equation 3, $$Vg2 = Vds1 + V_{R2} \qquad \text{Equation 3:}$$

Herein, the second output voltage Vout2 corresponds to a value obtained by subtracting the gate-source voltage Vgs2 of the transistor M2 from the gate voltage Vg2 of the transistor M2. Referring to Equation 3, a relationship of Equation 4 may be established for the second output $$Vout2 = Vg2 - Vgs2 = Vds1 + V_{R2} - Vgs2 \qquad \text{Equation 4:}$$

In Equations 3 and 4, Vds1 and Vgs2 are determined depending on the design process of the transistors M1 and M2. Further, in Equation 4, $V_{R2}$ is determined depending on the magnitude of the current I1. Comparing Equation 2 and Equation 4, the second output voltage Vout2 may have a voltage that is greater than the first output voltage Vout1 by a predetermined voltage VR2−Vgs2+Vgs3.

As described above, the first output voltage generator 111a of the regulator circuit 110a generates and outputs the first output voltage Vout1. In addition, the second output voltage generator 112a of the regulator circuit 110a generates and outputs the second output voltage Vout2, which is a predetermined voltage that is added into the first output voltage Vout. Herein, the second output voltage Vout2 is lower than a voltage of the power VDD.

Further, since the currents I1 and I2 decrease as the values of the resistors R1 and R2 and R3 are larger, it may be advantageous that the values of the resistors R1 and R2 and the resistor R3 are larger in order to reduce a consumption current. However, too large values of the resistors R1 and R2 and the resistor R3 may delay a time when the gate voltage Vg3 of the transistor M3 has a normal voltage. At least one of the values of the resistors R1 and R2 may be greater than the value of the resistor R3 in consideration of such transient response characteristic.

In FIG. 4, the resistor R3 serves to reduce a change in the transient response characteristic for the value of the first output voltage Vout1. Since the resistor R3 provides a current bypass path between the first output voltage Vout1 and the ground, it is possible to reduce a change in the transient response characteristic of the first output voltage Vout1. The first output voltage Vout1 may vary depending on an external load (e.g., a device that receives Vout1), and the resistor R3 serves to reduce a variation of the first output voltage Vout. That is, the resistor R3 may stabilize the first output voltage Vout1.

As described above, the regulator circuit may supply a plurality of more stable regulating voltages Vout1 and Vout2 even when the power VDD is directly supplied from the battery. The power VDD supplied from the battery may have a voltage of 3.0 to 4.6 V, and a transistor included in the decoder 120 may have a drain-source breakdown voltage of 3.5 V. In view of this point, the regulator circuit may supply a plurality of regulating voltages that are lower than the drain-source breakdown voltage of the transistor. That is, the front-end module may supply a stable voltage through a regulator circuit positioned therein without an external power management IC (PMIC).

Figure 5:
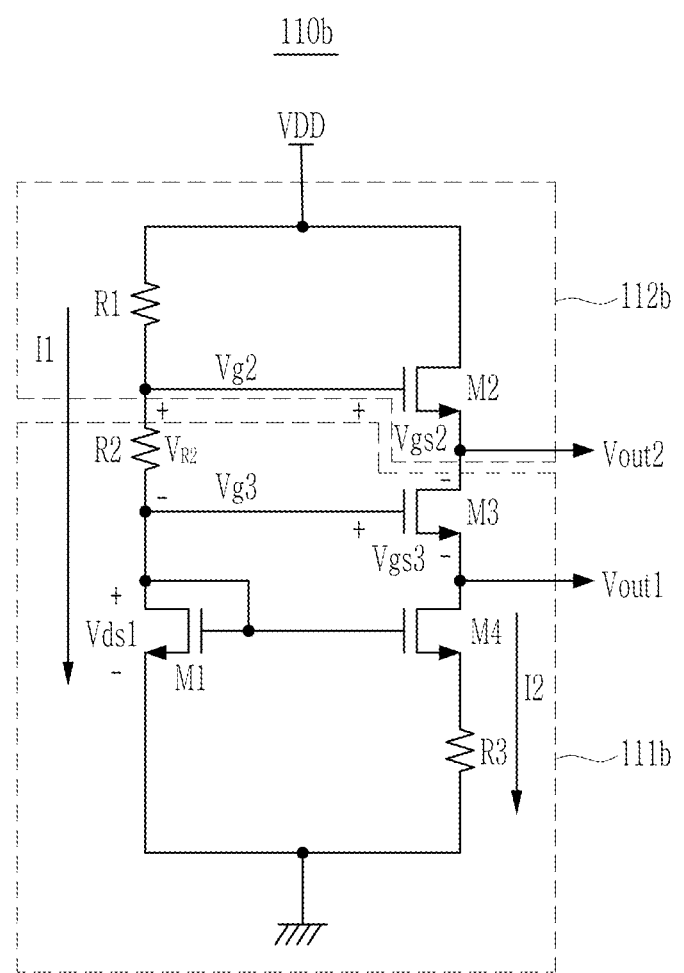
FIG. 5 illustrates another example of a circuit diagram showing a specific configuration of a regulator circuit.

FIG. 5 illustrates another example of a circuit diagram showing a specific configuration of a regulator circuit.

As illustrated in FIG. 5, the regulator circuit 110b may include a first output voltage generator 111b and a second output voltage generator 112b. Since the regulator circuit 110b of FIG. 5 is the same except that the transistor M4 is added into the regulator circuit 110a of FIG. 4, a duplicate description will be omitted.

A gate of transistor M4 is connected to the gate of transistor M1, and a drain of transistor M4 is connected to the source of transistor M3. The resistor R3 is connected between a source of the transistor M4 and the ground. In the regulator circuit 110b of FIG. 5, the transistor M4 may provide a current bypass path between the first output voltage Vout1 and the ground in addition to the resistor R3. That is, the transistor M4 and the resistor R3 serve to reduce a change in the transient response characteristic of the first output voltage Vout1. The first output voltage Vout1 may vary depending on an external load (e.g., a device that receives Vout1), and the transistor M4 and the resistor R3 serve to reduce a variation of the first output voltage Vout. That is, the transistor M4 and the resistor R3 may stabilize the first output voltage Vout1.

Figure 6:
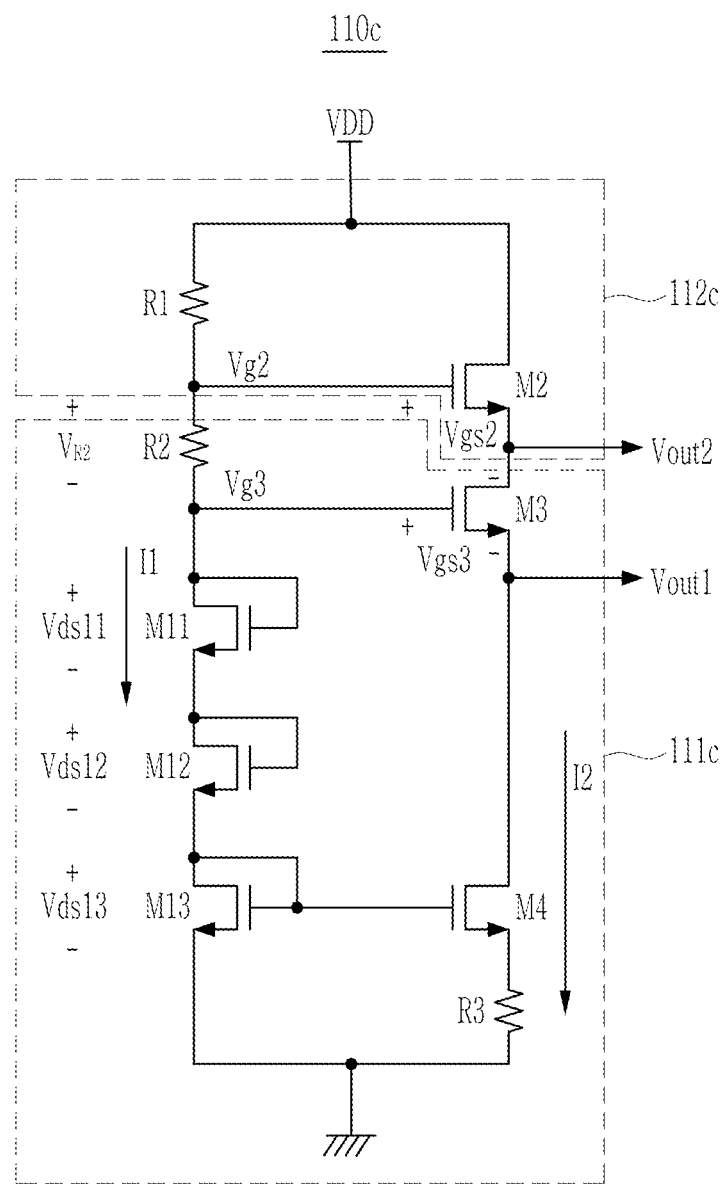
FIG. 6 illustrates another example of a circuit diagram showing a specific configuration of a regulator circuit.

FIG. 6 illustrates another example of a circuit diagram showing a specific configuration of a regulator circuit.

As illustrated in FIG. 6, the regulator circuit 110c may include a first output voltage generator 111c and a second output voltage generator 112c. Since the regulator circuit 110c of FIG. 6 is the same except that the transistor M1 is replaced with transistors M11, M12, and M13 stacked on top of each other, a duplicate description will be omitted.

As described in FIG. 4, the transistor M1 serves to supply the gate voltage Vg3 of the transistor M3. Accordingly, the transistor M3 may stack a plurality of transistors, thereby supplying the gate voltage Vg3 of the transistor M3 with a higher voltage. The regulator circuit 110c of FIG. 6 is an example in which three transistors M11, M12, and M13 are stacked, but two transistors or four or more transistors may be stacked depending on a design.

A gate and a drain of the transistor M13 are connected to each other, and a source of the transistor M13 is connected to a ground. A gate and a drain of the transistor M12 are connected to each other, and a source of the transistor M12 is connected to the drain of the transistor M13. A gate and a drain of the transistor M11 are connected to each other, and a source of the transistor M11 is connected to the drain of the transistor M12. The drain of the transistor M11 is connected to the first end of the resistor R2 and the gate of the transistor M3. As such, the transistors M11, M12, and M13 each have a diode connection structure, and they are stacked between the gate of the transistor M3 of and the ground.

In FIG. 6, a drain-source voltage of the transistor M11 is represented as Vds11, a drain-source voltage of the transistor M12 is represented as Vds12, and a drain-source voltage of the transistor M13 is represented as Vds13. Accordingly, the gate voltage of the transistor M3 becomes as in Equation 5 below.

$$Vg3 = Vds13 + Vds12 + Vds11 = 3Vds \qquad \text{Equation 5:}$$

In Equation 5, it is assumed that Vds13=Vds12=Vds11=Vds, and Vg3=3Vds.

For example, when the voltage of the power VDD is 3.8 V, it is assumed that Vds is 0.52 V. When Equation 5 is applied, Vg3 becomes 1.56 V (=0.52*3). When the gate-source voltage Vgs3 of the transistor M3 is 0.45 V, the first output voltage Vout1 may have 1.11 V (=1.56−0.45) depending on Equation 2.

Figure 7:
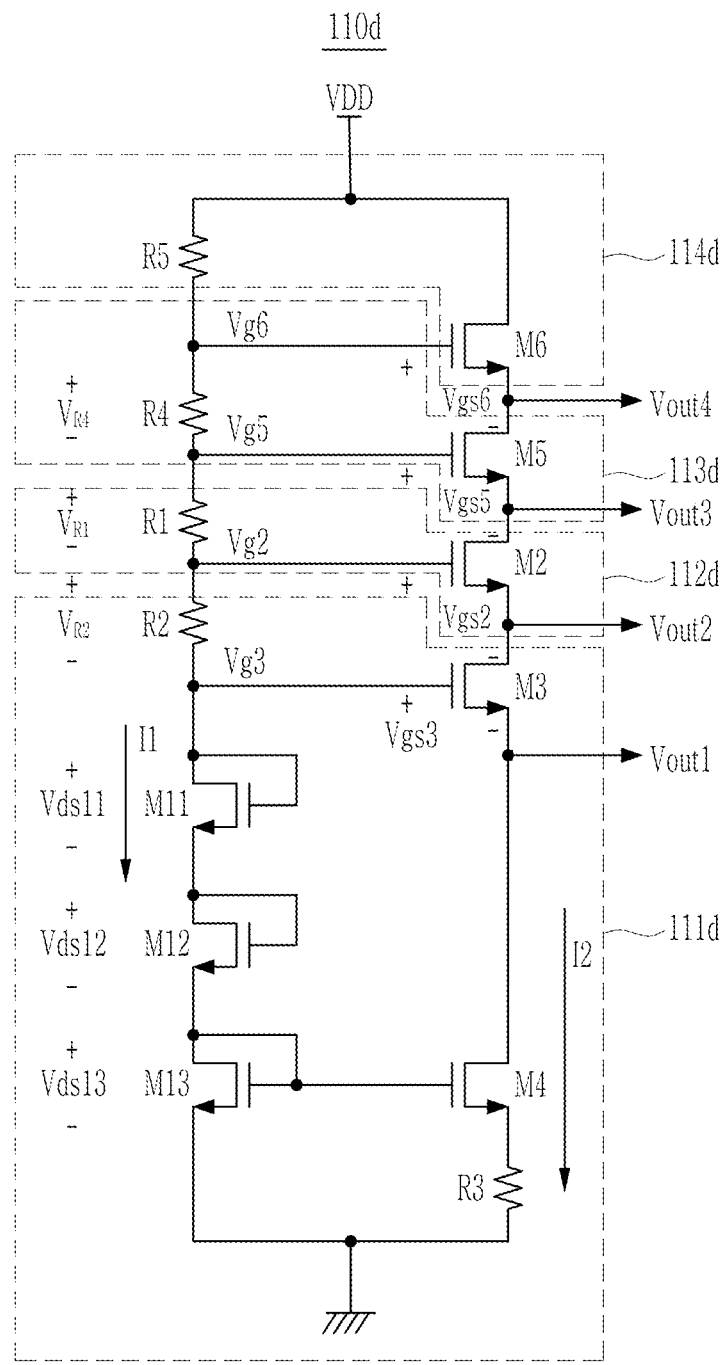
FIG. 7 illustrates another example of a circuit diagram showing a specific configuration of a regulator circuit.

Hereinafter, a case in which a regulator circuit generates an additional output voltage in addition to the two output voltages Vout1 and Vout2 will be described with reference to FIG. 7. In FIG. 7, as an example, a case where a regulator circuit generates four output voltages Vout1, Vout2, Vout3, and Vout4 will be described, but it is possible to generate three output voltages or five or more output voltages.

FIG. 7 illustrates another example of a circuit diagram showing a specific configuration of a regulator circuit.

As illustrated in FIG. 7, the regulator circuit 110d may include a first output voltage generator 111d, a second output voltage generator 112d, a third output voltage generator 113d, and a fourth output voltage generator 114d.

The first output voltage generator 111d and the second output voltage generator 112d of FIG. 7 are similar in structure to the first output voltage generator 111c and the second output voltage generator 112c in FIG. 6, respectively, and thus a detailed description will be omitted.

The third output voltage generator 113d may include a resistor R4 and a transistor M5. In addition, the fourth output voltage generator 114d may include a resistor R5 and a transistor M6.

The drain of the resistor R4 is connected to the first end of the resistor R1 and the gate of the transistor M5. The drain of the resistor R3 is connected to the first end of the resistor R5 and the gate of the transistor M6. The gate of the transistor M5 is connected to a contact point between the resistor R1 and the resistor R4. The source of the transistor M5 is connected to the drain of transistor M2, and the drain of transistor M5 is connected to the source of transistor M6.

The resistor R5 is connected between the power VDD and a second end of the resistor R4. The gate of the transistor M6 is connected to a contact point between the resistor R4 and the resistor R5, and a drain of the transistor M6 is connected to the power VDD. In addition, a source of the transistor M6 is connected to the drain of the transistor M5.

In FIG. 7, a source voltage of the transistor M5 corresponds to the third output voltage Vout3, and a source voltage of the transistor M6 corresponds to the fourth output voltage Vout4. Further, a gate voltage of the transistor M5 is represented as Vg5, and a gate voltage of the transistor M6 is represented as Vg6. A gate-source voltage of the transistor M5 is represented as Vgs5, and a gate-source voltage of the transistor M6 is represented as Vgs6. In addition, a voltage across the resistor R1 is represented as $V_{R1}$, and a voltage across the resistor R4 is represented as $V_{R4}$.

The gate voltage Vg5 of the transistor M5 corresponds to a value obtained by adding the voltage VR, across the resistor R1 into the gate voltage Vg2 of the transistor M2. Referring to Equation 3 and Equation 5, the gate voltage Vg5 of the transistor M5 becomes as in Equation 6.

$$Vg5 = Vds13 + Vds12 + Vds11 + V_{R2} + V_{R1} = 3Vds + V_{R2} + V_{R1} \qquad \text{Equation 6:}$$

In Equation 6, it is assumed that Vds13=Vds12=Vds11=Vds.

Herein, the third output voltage Vout3 corresponds to a value obtained by subtracting the gate-source voltage Vgs5 of the transistor M5 from the gate voltage Vg5 of the transistor M5. Referring to Equation 6, a relationship of Equation 7 may be established for third output voltage Vout3.

$$Vout3 = Vg5 - Vgs5 = 3Vds + V_2 + V_{R1} - Vgs5 \qquad \text{Equation 7:}$$

Comparing Equation 4 and Equation 7, the third output voltage Vout3 may have a voltage that is greater than the second output voltage Vout2 by a predetermined voltage.

Further, the gate voltage Vg6 of the transistor M6 corresponds to a value obtained by adding the voltage $V_{R4}$ across the resistor R4 to the gate voltage Vg5 of the transistor M5. Referring to Equation 6, the gate voltage of the transistor M6 becomes as in Equation 8.

$$Vg6 = 3Vds + V_{R2} + V_{R1} + V_{R4} \qquad \text{Equation 8:}$$

In Equation 8, it is assumed that Vds13=Vds12=Vds11=Vds.

Herein, the fourth output voltage Vout4 corresponds to a value obtained by subtracting the gate-source voltage Vgs6 of the transistor M6 from the gate voltage Vg6 of the transistor M6. Referring to Equation 8, a relationship of Equation 9 may be established for the fourth output voltage Vout4.

$$Vout4 = Vg6 - Vgs6 = 3Vds + V_{R2} + V_{R1} + V_{R4} - Vgs6 \qquad \text{Equation 9:}$$

Comparing Equation 7 and Equation 9, the fourth output voltage Vout4 may have a voltage that is greater than the third output voltage Vout3 by a predetermined voltage.

As such, the third output voltage generator 113d may be connected between the power VDD and the second output voltage generator 112d, to output a third output voltage Vout3 obtained by adding a predetermined voltage to the second output voltage Vout2. In addition, the third output voltage generator 114d may be connected between the power VDD and the third output voltage generator 113d, to output a fourth output voltage Vout4 obtained by adding a predetermined voltage to the third output voltage Vout3.

Figure 8A:
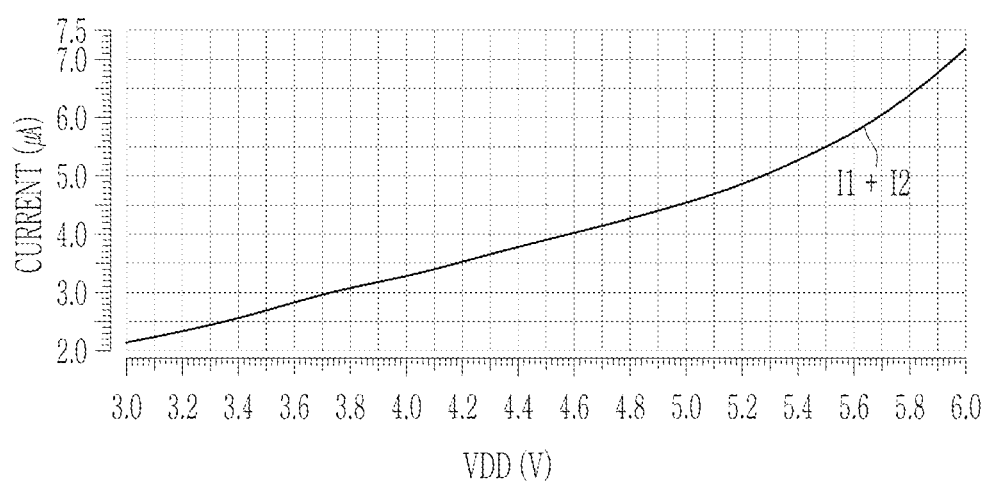
FIG. 8A and FIG. 8B illustrate simulation results of the regulator circuit of FIG. 7.
Figure 8B:
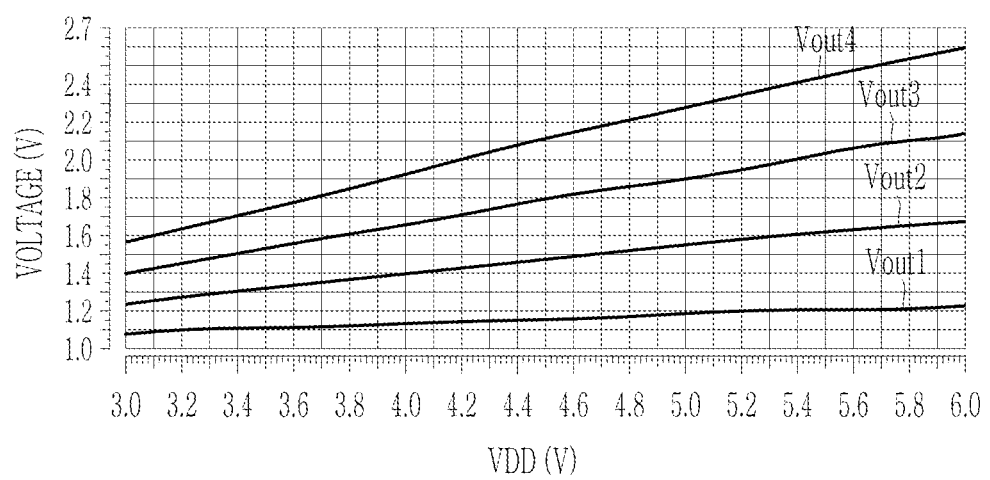

FIG. 8A and FIG. 8B illustrate simulation results of the regulator circuits 110d of FIG. 7. In more detail, FIG. 8A illustrates a current I1+I2 obtained by summing the current I1 and the current I2 depending on a voltage change of the power VDD, and FIG. 8B illustrates the first to fourth output voltages Vout1 to Vout4 depending on the voltage change of the power VDD. In simulations of FIG. 8A and FIG. 8B, it is assumed that the value of the resistor R5 is 300 Kohms, and the value of each of the resistors R4, R1, R2, and R3 is 100 Kohms.

Referring to FIG. 8A, when the voltage of the power VDD changes from 3 V to 5 V, the current consumption I1+I2 varies from 2.1 uA to 4.5 uA. This consumption current represents a current for a case in which the regulator circuit 110d is in an idle state. For example, when an inverter receives an output voltage from a regulator circuit, the inverter receives an output current from the regulator circuit during a switching operation (ON⇆OFF). When the inverter maintains one state of the switching operation (ON or OFF), the regulator circuit enters an idle state because the output current is not supplied from the regulator circuit. The regulator circuit has the consumption current I1+I2 in a range of 2.1 uA to 4.5 uA in this standby state, which satisfies a system design specification of 10 uA or less.

Referring to FIG. 8B, when the voltage of the power VDD changes from 3 V to 5 V, the output voltages Vout1 to Vout4 varies from 1.07 V-2.28 V. Such output voltages Vout1 to Vout4 correspond to a voltage that is lower than a drain-source breakdown voltage of a transistor included in the inverter. Accordingly, the inverter may not be destroyed even when the voltage is supplied from the regulator circuit.

FIG. 9 illustrates an application example of a regulator circuit. The entire circuit of FIG. 9 may be included in the controller 100 of the front-end module. In more detail, the entire circuit of FIG. 9 exemplarily shows a case where a regulator circuit 910 supplies an output voltage to an inverter included in the decoder 120.

The regulator circuit 910 may be any one of the regulator circuits 110a, 110b, 110c, and 110d described in FIG. 4 to FIG. 7. Hereinafter, for better understanding and ease of description, it is assumed that the regulator circuit 910 is the regulator circuit 110d of FIG. 7 that generates four output voltages. The regulator circuit 910 generates four output voltages Vout1, Vout2, Vout3, and Vout4 as regulating voltages, to supply them to an inverter unit 920. Further, in FIG. 9, currents supplied from the regulator circuit 910 to the inverter unit 920 are represented as I3, I4, I5, and I6.

The inverter unit 920 may include first to fifth inverters 921, 922, 923, 924, and 925. That is, the inverter unit 920 may include an inverter chain in which a plurality of inverters are connected to each other. The inverter unit 920 may receive an input signal Vin having a low voltage to output an output signal having a high voltage. That is, each of the first to fifth inverters 921, 922, 923, 924, and 925 may output increasingly higher voltages. As an example, an input signal of the inverter unit 920 may have a low voltage as a digital signal. The inverter unit 920 may receive such a low voltage to output a switching signal that is a high voltage capable of driving a switch. In addition, the inverter unit 920 receives the output voltages Vout1, Vout2, Vout3, and Vout4 from the regulator circuit 910 as operating power.

The first inverter 921 may include two transistors Mp1 and Mn1. The transistor Mp1 may be a p-type transistor, and a source of the transistor Mp1 receives the first output voltage Vout1 from the regulator circuit 910. The transistor Mn1 may be an n-type transistor, and a drain of the transistor Mn1 is connected to a drain of the transistor Mp1. A source of the transistor Mn1 is connected to the ground, and a gate of the transistor Mp1 and a gate of the transistor Mn1 are connected to each other. An input signal Vin is applied at a contact point between the gate of the transistor Mp1 and the gate of the transistor Mn1. The output signal Vout1/0 is outputted at a contact point between the drain of the transistor Mp1 and the drain of the transistor Mn1. Herein, the input signal Vin may be 0 V or 1.8 V. 0 V corresponds to a low level, and 1.8 V corresponds to a high level.

The second inverter 922 may include two transistors Mp2 and Mn2. The transistor Mp2 may be a p-type transistor, and a source of the transistor Mp2 receives the second output voltage Vout2 from the regulator circuit 910. The transistor Mn2 may be an n-type transistor, and a drain of the transistor Mn2 is connected to a drain of the transistor Mp2. A source of the transistor Mn2 is connected to the ground, and a gate of the transistor Mp2 and a gate of the transistor Mn2 are connected to each other. The output signal Vout1/0 of the first inverter 921 is applied as an input signal at a contact point between the gate of the transistor Mp2 and the gate of the transistor Mn2. An output signal 0/Vout2 is outputted at a contact point between the drain of the transistor Mp2 and the drain of the transistor Mn2.

The third inverter 923 may include two transistors Mp3 and Mn3. The transistor Mp3 may be a p-type transistor, and a source of the transistor Mp3 receives the third output voltage Vout3 from the regulator circuit 910. The transistor Mn3 may be an n-type transistor, and a drain of the transistor Mn3 is connected to a drain of the transistor Mp3. A source of the transistor Mn3 is connected to the ground, and a gate of the transistor Mp3 and a gate of the transistor Mn3 are connected to each other. The output signal 0/Vout2 of the second inverter 922 is applied as an input signal at a contact point between the gate of the transistor Mp3 and the gate of the transistor Mn3. The output signal Vout3/0 is outputted at a contact point between the drain of the transistor Mp3 and the drain of the transistor Mn3.

The fourth inverter 924 may include two transistors Mp4 and Mn4. The transistor Mp4 may be a p-type transistor, and a source of the transistor Mp4 receives the fourth output voltage Vout4 from the regulator circuit 910. The transistor Mn4 may be an n-type transistor, and a drain of the transistor Mn4 is connected to a drain of the transistor Mp4. A source of the transistor Mn4 is connected to the ground, and a gate of the transistor Mp4 and a gate of the transistor Mn4 are connected to each other. The output signal Vout3/0 of the third inverter 923 is applied as an input signal at a contact point between the gate of the transistor Mp4 and the gate of the transistor Mn4. An output signal 0/Vout4 is outputted at a contact point between the drain of the transistor Mp4 and the drain of the transistor Mn4.

The fifth inverter 925 may include two transistors Mp5 and Mn5. The transistor Mp5 may be a p-type transistor, and a source of the transistor Mp5 receives the fourth output voltage Vout4 from the regulator circuit 910. The transistor Mn5 may be an n-type transistor, and a drain of the transistor Mn5 is connected to a drain of the transistor Mp5. A source of the transistor Mn5 is connected to the ground, and a gate of the transistor Mp5 and a gate of the transistor Mn5 are connected to each other. The output signal 0/Vout4 of the fourth inverter 924 is applied as an input signal at a contact point between the gate of the transistor Mp5 and the gate of the transistor Mn5. The output signal Vout4/0 is outputted at a contact point between the drain of the transistor Mp5 and the drain of the transistor Mn5.

Herein, the output signal Vout4/0 of the fifth inverter 925 corresponds to a final output signal of the inverter unit 920. The inverter unit 920 may include an odd number of inverters to invert the input signal Vin, and may be implemented as an inverter chain including five inverters as illustrated in FIG. 9 in order to set a voltage level of the final output signal to be high.

First, an operation method for a case where the inverter unit 920 receives a low level of 0 V as an input signal Vin will be described.

Since the first inverter 921 receives 0 V, the transistor Mp1 is turned on. The first inverter 921 outputs the first output voltage Vout1 supplied from the regulator circuit 910 by turn-on of the transistor Mp1

Since the second inverter 922 receives Vout1, the transistor Mn2 is turned on. The second inverter 922 outputs 0 V by turn-on of the transistor Mn2. Since the third inverter 923 receives 0 V, the transistor Mp3 is turned on. The third inverter 923 outputs the third output voltage Vout3 supplied from the regulator circuit 910 by turn-on of the transistor Mp3. Since the fourth inverter 924 receives Vout3, the transistor Mn4 is turned on. The fourth inverter 924 outputs 0 V by turn-on of the transistor Mn4. In addition, since the fifth inverter 925 receives 0 V, the transistor Mp5 is turned on. The fifth inverter 925 finally outputs the fourth output voltage Vout4 supplied from the regulator circuit 910 by turn-on of the transistor Mp5.

Next, an operation method for a case where the inverter unit 920 receives a high level of 1.8 V as an input signal Vin will be described.

Since the first inverter 921 receives 1.8 V, the transistor Mn1 is turned on. The first inverter 921 outputs 0 V by turn-on of the transistor Mn1. Since the second inverter 922 receives 0 V, the transistor Mp2 is turned on. The second inverter 922 outputs the second output voltage Vout2 supplied from the regulator circuit 910 by turn-on of the transistor Mp2. Since the third inverter 923 receives Vout2, the transistor Mn3 is turned on. The third inverter 923 outputs 0 V by turn-on of the transistor Mn3. Since the fourth inverter 924 receives 0 V, the transistor Mp4 is turned on. The fourth inverter 924 outputs the fourth output voltage Vout4 supplied from the regulator circuit 910 by turn-on of the transistor Mp4. In addition, since the fifth inverter 925 receives Vout4, the transistor Mn5 is turned on. The fifth inverter 925 finally outputs 0 V by turn-on of the transistor Mp5.

Further, referring to Equation 2, Equation 4, Equation 7, and Equation 9, a plurality of output voltages of the regulator circuit 910 may satisfy a relationship of Equation 10.

$$Vout1 < Vout2 < Vout3 < Vout4 < VDD \qquad \text{Equation 10:}$$

In FIG. 9, the first output voltage Vout1 needs to satisfy a relationship of Equation 11 in order to prevent an abnormal operation of the first inverter 921.

$$Vout1 - Vth\_Mp1 \le Vin\_max \qquad \text{Equation 11:}$$

In Equation 11, Vth_Mp1 represents a threshold voltage of the transistor Mp1, and Vin_max represents a maximum voltage value of the input signal Vin of the first inverter. When Vin_max (e.g., 1.8 V) is smaller than Vout1-Vth_Mp1, the transistor Mn1 and the transistor Mp1 may be simultaneously turned on. Accordingly, a current flows to the first inverter 921, and an abnormal operation occurs. The first output voltage needs to satisfy Equation 11 in order to prevent such an abnormal operation.

The relationship of Equation 11 may be equally applied to the second to fifth inverters 922 to 925. Accordingly, the second to fourth output voltages Vout2 to Vout4 also need to satisfy a relationship of Equation 12 in order to prevent the abnormal operation of the second to fifth inverters 922 to 925.

$$Vout2 - Vth\_Mp2 \le Vout1$$

$$Vout3 - Vth\_Mp3 \le Vout2$$

$$Vout4 - Vth\_Mp4 \le Vout3 \qquad \text{Equation 12:}$$

In Equation 12, Vth_Mp2, Vth_Mp3, and Vth_Mp4 represent threshold voltages of the transistor Mp2, the transistor Mp3, and the transistor Mp4, respectively.

In addition, the fourth output voltage Vout4 needs to have a value that is lower than a breakdown voltage BVds for each inverter of the inverter unit 920. Accordingly, destruction of the inverters 921 to 925 may be prevented. Referring to the simulation result of FIG. 8B, the output voltages Vout1 to Vout4 are varied from 1.07 V to 2.28 V. This output voltage range is a voltage that is lower than a drain-source breakdown voltage (e.g., 3.6 V) of transistors (e.g., Mp1 and Mn1) included in the inverter unit 920. Accordingly, the inverter unit 920 may not be destroyed.

In FIG. 9, when the first to fifth inverters 921 to 925 are in the switching operation (ON OFF), the first to fifth inverters 921 to 925 operate by receiving the currents I3, I4, I5, and I6 from the regulator circuit 910, respectively. When the first to fifth inverters 921 to 925 maintain one state of the switching operation (ON or OFF), the regulator circuit enters an idle state because the output current is not supplied from the regulator circuit (i.e. I3, I4, I5, and I6 are 0 A). Referring to FIG. 8A, since the regulator circuit has a current consumption in the range of 2.1 uA to 4.5 uA when in a standby state, a system design specification (10 uA or less) may be satisfied.

According to at least one of the examples, destruction of an internal circuit may be prevented without a separate PMIC by converting the voltage supplied from the battery into a plurality of regulating voltages.

According to at least one of the examples, current consumption in a standby state of the regulator circuit may be reduced.

According to at least one of the examples, the regulator circuit may output the regulating voltages, thereby effectively driving an inverter connected to multiple stages.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A regulator circuit, comprising:
a first output voltage generator configured to include a first resistor having a first end connected to a power terminal having externally supplied power, a first transistor connected between a second end of the first resistor and a ground terminal to supply a first voltage, and a second transistor receiving the first voltage through a control terminal of the second transistor and outputting a first output voltage through a first terminal of the second transistor; and
a second output voltage generator connected between the power terminal and the first output voltage generator to output a second output voltage obtained by adding a predetermined voltage into the first output voltage.

2. The regulator circuit of claim 1, wherein
the second output voltage generator includes:
a second resistor connected between the power terminal and the first resistor; and
a third transistor configured to receive a second voltage obtained by adding a voltage across the first resistor into the first voltage through a control terminal of the third transistor, and output the second output voltage through a first terminal of the third transistor.

3. The regulator circuit of claim 2, wherein
a second terminal of the third transistor is connected to the power terminal, and the first terminal of the third transistor is connected to a second terminal of the second transistor.

4. The regulator circuit of claim 1, wherein
the first output voltage generator further includes a second resistor connected between the first terminal of the second transistor and the ground terminal.

5. The regulator circuit of claim 4, wherein
the first output voltage generator further includes a third transistor configured to have a control terminal of the third transistor connected to the control terminal of the first transistor, a first terminal of the third transistor connected to the second resistor, and a second terminal of the third transistor connected to the first terminal of the second transistor.

6. The regulator circuit of claim 1, wherein
a control terminal and a first terminal of the first transistor are connected to each other, the first terminal of the first transistor is connected to the second end of the first resistor, and a second terminal of the first transistor is connected to the ground terminal.

7. The regulator circuit of claim 1, wherein
the first transistor includes a plurality of transistors having a diode-connection structure, and
the plurality of transistors supply the first voltage to the control terminal of the second transistor.

8. The regulator circuit of claim 2, further comprising:
a third output voltage generator configured to include a third resistor connected between the power terminal and the second resistor; and
a fourth transistor configured to receive a third voltage obtained by adding a voltage across the second resistor into the second voltage through a control terminal of the fourth transistor, and output a third output voltage through a first terminal of the fourth transistor.

9. The regulator circuit of claim 8, wherein
the third output voltage is higher than the second output voltage.

10. The regulator circuit of claim 1, wherein
the power of the power terminal is supplied from a battery.

11. A regulator circuit, comprising:
a first resistor configured to have a first end connected to a power terminal;
a second resistor configured to have a first end connected to a second end of the first resistor;
a first transistor, connected between a second end of the second resistor and a ground terminal, configured to supply a first voltage;
a second transistor configured to receive the first voltage through a control terminal, and output the first output voltage through a first terminal;
a third transistor configured to receive a second voltage obtained by adding a voltage across the second resistor into the first voltage through a control terminal of the third transistor, and output a second output voltage through a first terminal of the third transistor; and
a third resistor connected between the first terminal of the second transistor and the ground terminal.

12. The regulator circuit of claim 11, wherein
a control terminal and a first terminal of the first transistor are connected to each other.

13. The regulator circuit of claim 11, wherein
a second terminal of the third transistor is connected to the power terminal, and the first terminal of the third transistor is connected to a second terminal of the second transistor.

14. The regulator circuit of claim 12, further comprising
a fourth transistor configured to have a control terminal connected to the control terminal of the first transistor, a first terminal connected to the third resistor, and a second terminal connected to the first terminal of the second transistor.

15. The regulator circuit of claim 11, wherein
the first transistor has a diode-connection structure and includes a plurality of transistors stacked between the second end of the second resistor and the ground terminal, and
the plurality of transistors supply the first voltage to a control terminal of the first transistor.

16. The regulator circuit of claim 11, further comprising:
a fourth resistor connected between the power terminal and the first resistor; and
a fourth transistor configured to receive a third voltage obtained by adding a voltage across the first resistor into the second voltage through a control terminal of the fourth transistor, and output a third output voltage through a first terminal of the fourth transistor.

17. The regulator circuit of claim 16, wherein
the second output voltage is higher than the first output voltage, and the third output voltage is higher than the second output voltage.

18. A front-end module, comprising:
a regulator configured to include a first output voltage generator connected between a power terminal and a ground terminal to output a first output voltage, and a second output voltage generator connected between the power terminal and the first output voltage generator to output a second output voltage obtained by adding a predetermined voltage into the first output voltage; and
an inverter unit comprising a first inverter configured to operate by receiving the first output voltage to output the first output voltage in response to an input signal, and a second inverter configured to operate by receiving the second output voltage to output the second output voltage in response to an output signal of the first inverter.

19. The front-end module of claim 18, wherein
the regulator circuit further includes a third output voltage generator connected between the power terminal and the second output voltage generator to output a third output voltage obtained by adding another predetermined voltage into the second output voltage, and
the inverter unit further includes a third inverter configured to operate by receiving the third output voltage to output the third output voltage in response to an output signal of the second inverter.

20. The front-end module of claim 19, wherein
the second output voltage is equal to or higher than a voltage obtained by subtracting a threshold voltage of a transistor included in the third inverter from the third output voltage.

\* \* \* \* \*